United States Patent [19]
Yoshida et al.

[11] Patent Number: 4,835,790

[45] Date of Patent: May 30, 1989

[54] CARRIER-TO-NOISE DETECTOR FOR DIGITAL TRANSMISSION SYSTEMS

[75] Inventors: Shousei Yoshida; Susumu Otani; Toshiya Todoroki, all of Tokyo, Japan

[73] Assignee: NEC Corporation, Japan

[21] Appl. No.: 210,657

[22] Filed: Jun. 23, 1988

[30] Foreign Application Priority Data

Jun. 23, 1987 [JP] Japan .............................. 62-156044
Jun. 23, 1987 [JP] Japan .............................. 62-156045
Jun. 29, 1987 [JP] Japan .............................. 62-162109
Jul. 14, 1987 [JP] Japan .............................. 62-175658

[51] Int. Cl.$^4$ ............................................. H04B 1/10
[52] U.S. Cl. ...................................... 375/10; 375/97; 455/226
[58] Field of Search ................... 375/10, 81, 97, 99; 455/226, 257, 260, 324, 135; 329/122, 124; 324/77 R

[56] References Cited

U.S. PATENT DOCUMENTS

| | | | |
|---|---|---|---|
| 3,238,457 | 3/1966 | Boymel et al. | 455/226 |
| 3,302,116 | 1/1967 | Free | 375/10 |
| 3,350,643 | 10/1967 | Webb | 455/226 |
| 4,253,189 | 2/1981 | Lemoussu et al. | 375/97 |
| 4,466,108 | 8/1984 | Rhodes | 375/97 |

Primary Examiner—Benedict V. Safourek
Attorney, Agent, or Firm—Ostrolenk, Faber, Gerb & Soffen

[57] ABSTRACT

A carrier-to-noise detector comprises an A/D converter (1) which samples an output of the demodulator of a digital transmission system at a symbol clock rate and converting it to a digital signal having positive and negative values. An absolute value converting circuit (2) converts the output of A/D converter into an absolute value which is averaged by a first averaging circuit (3) over a period sufficient to suppress short term variations and then squared by a first squaring circuit (4) to give an output representing the carrier component. The output of A/D converter is, on the other hand, squared by a second squaring circuit (5) and averaged by a second averaging circuit (6) to suppress short term variations to give an output representing a total of the carrier and noise components. The carrier component in the output of the second averaging circuit 6 is subtracted by a subtractor (7). A ratio between the outputs of the first squaring circuit (4) and subtracting circuit (7) is derived by a divider (8) as a representation of a carrier-to-noise ratio.

13 Claims, 10 Drawing Sheets

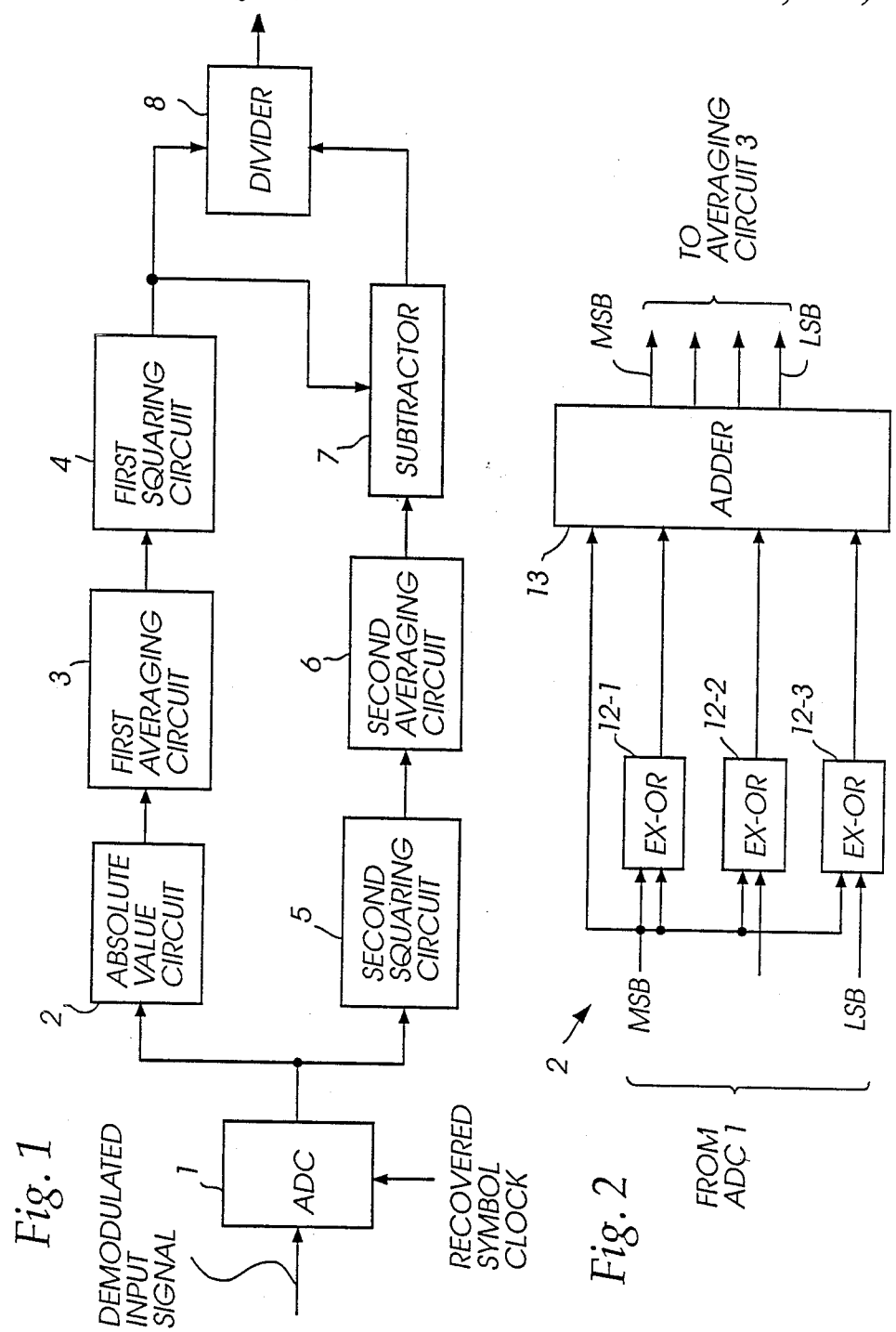

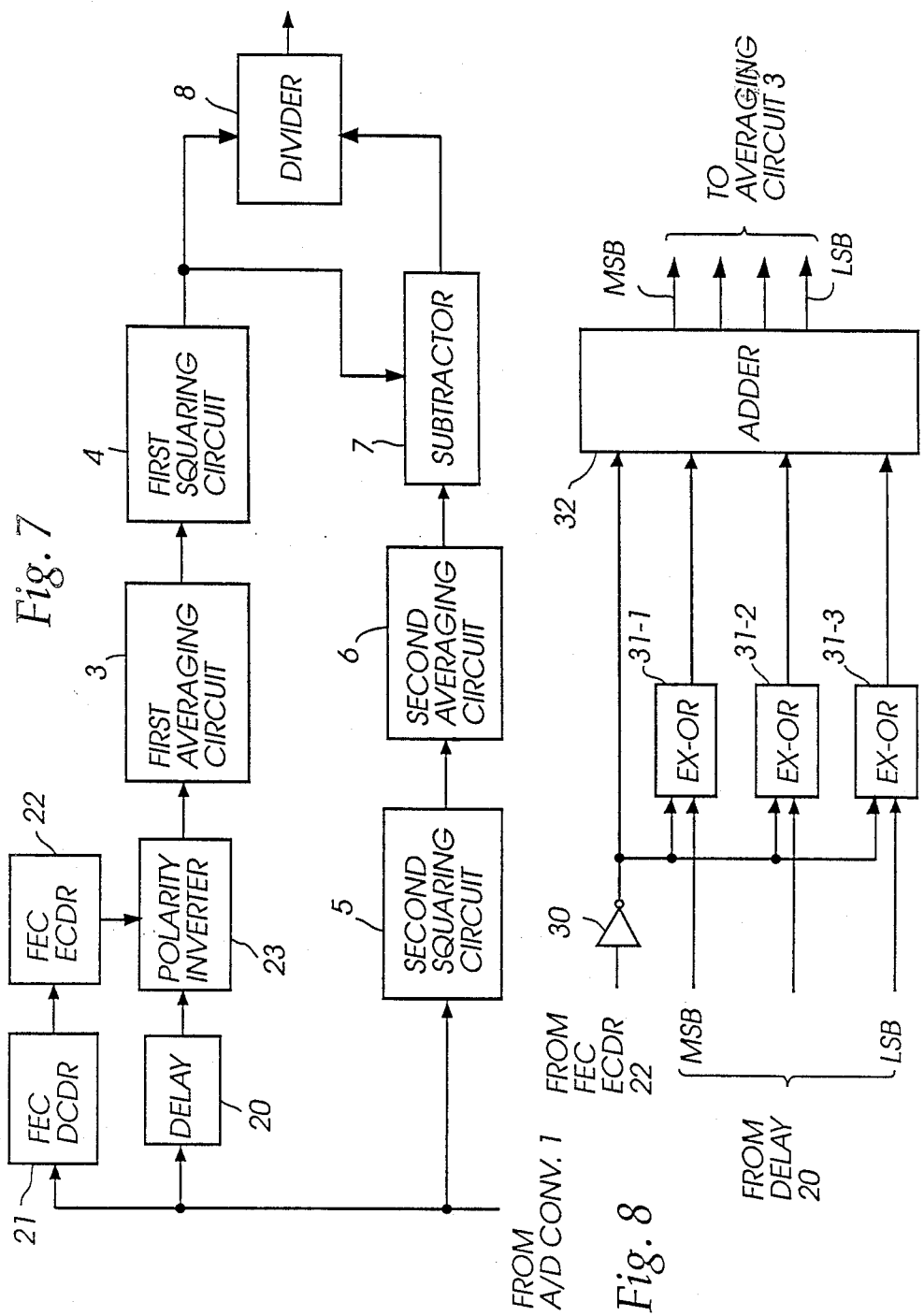

CARRIER-TO-NOISE DETECTOR FOR DIGITAL TRANSMISSION SYSTEMS

BACKGROUND OF THE INVENTION

The present invention relates to a carrier-to-noise detector for digital transmission systems.

The operating performance of the demodulator of a digital transmission system is evaluated by the ratio of per-bit energy to noise ($E_b/N_o$) of a demodulated digital signal which is defined as:

$$\frac{E_b}{N_o} = \frac{C}{N} \cdot \frac{B}{R}$$

where C/N is a carrier to noise ratio, B, the equivalent noise bandwidth of the demodulator and R, the data transmission rate which is equal to the symbol rate in a 2-PSK system and equal to twice the symbol rate in a 4-PSK system. The C/N ratio is therefore a determining factor for system evaluation. In satellite communications systems, for example, the evaluation of a satellite channel is made by inserting a band-pass filter having a passband narrower than the bandwidth of the satellite transponder at the input of a demodulator. A test carrier having a frequency corresponding to the center frequency of the band-pass filter is transmitted to measure the level of power at the output of the filter which represents the total value (C+N). The carrier is then removed and the power level is again measured as a representation of the noise component N. The carrier component C is then obtained by subtracting the noise N from the total value (C+N) and finally the value C is divided by the noise value N to obtain the ratio C/N. The equivalent noise bandwidth of the band-pass filter corresponds to the constant B.

The procedures are carried out manually and the transmission system must, therefore, be interrupted.

SUMMARY OF THE INVENTION

It is therefore an object of this invention to provide a carrier-to-noise ratio detector which permits automatic measurement of the carrier-to-noise ratio of a digital transmission system without interrupting its service.

The carrier-to-noise detector of the invention comprises an analog-to-digital converter connected to a demodulator of the digital transmission system for sampling an output signal of the demodulator at a symbol clock rate and converting the sampled signal to a digital output signal having positive and negative values. An absolute value converting circuit is connected to the A/D converter for converting its output into an absolute value which is fed to a first averaging circuit for averaging the absolute value over a period sufficient to suppress short term variations. A first squaring circuit is coupled to the first averaging circuit to square the absolute value. The output of A/D converter is, on the other hand, squared by a second squaring circuit and averaged by a second averaging circuit over a period sufficient to suppress short term variations. The output of the first squaring circuit represents the carrier component, while the output of the second averaging circuit represents a total of the carrier and noise components. A subtractor substracts the outputs of the first squaring circuit and the second averaging circuit to detect the noise component. A ratio between the outputs of the first squaring circuit and the subtracting circuit is derived by a divider as a representation of a carrier-to-noise ratio.

To ensure high precision measurement at high noise levels, the absolute value converting circuit preferably comprises a forward error correcting (FEC) decoder connected to the ouput of the A/D converter, a forward error correcting encoder connected to the output of the FEC decoder, and a delay circuit for introducing a delay to the output signal of the A/D digital converter by an amount equal to a total of delays introduced by the FEC decoder and encoder. The polarity of the delayed signal is inverted or not inverted depending on the logic states of the output of the FEC encoder before being applied to the first averaging circuit. Alternatively, a weighting circuit is provided for multiplying the absolute value by a weighting factor and applying the weighted value to the first averaging circuit.

The C/N ratio is found to vary with a deviation of the frequency of the carrier recovered by the demodulator from the frequency of the received carrier. The carrier-to-noise ratio detector of the present invention can therefore be used instead of the costly automatic frequency control circuit for preventing the demodulator from being locked in a pseudo-sync state. This is accomplished by controlling a voltage controlled oscillator provided in a closed loop of the demodulator in accordance with the derived C/N ratio such that the latter is maintained at a maximum level.

BRIEF DESCRIPTION OF THE DRAWINGS

The present invention will be described in further detail with reference to the accompanying drawings, in which:

FIG. 1 is a block diagram of a carrier-to-noise detector according to a first embodiment of the present invention;

FIG. 2 is a circuit diagram of the absolute value circuit of FIG. 1;

FIG. 7 is a block diagram of the carrier-to-noise ratio detector according to a second embodiment of the invention;

FIG. 8 is a circuit diagram of the polarity inverter of FIG. 6;

DETAILED DESCRIPTION

Figure 3:
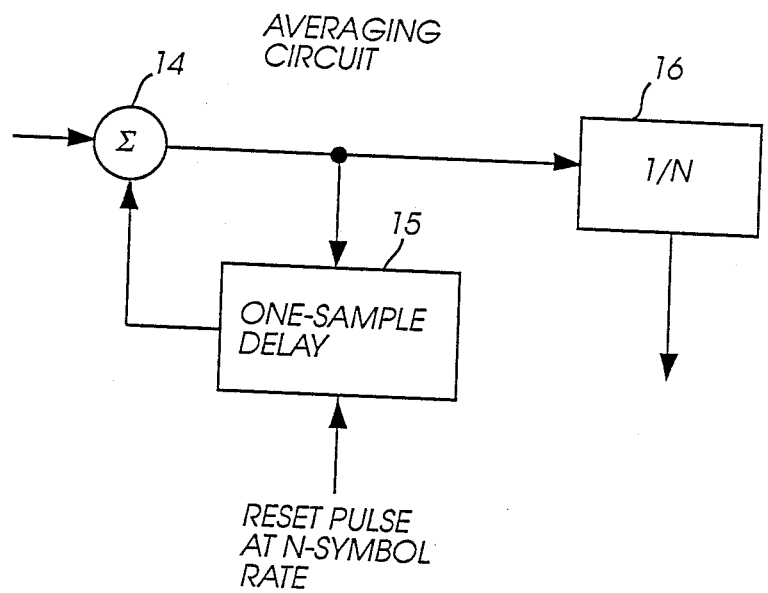
FIG. 3 is a circuit diagram of the delay circuit of FIG. 1.

Referring to FIG. 1, there is shown a C/N ratio detector according to a first embodiment of the present invention. The C/N detector comprises an analog-to-digital converter 1 which is connected to receive a demodulated 2-PSK signal from a demodulator, not shown, and driven at a clock rate used to recover symbols by the demodulator for sampling the demodulated signal at the recovered symbol rate. An absolute value circuit 2 is connected to the output of the A/D converter to convert the negative value of the digital output to a positive value and supplies an absolute value signal to a first averaging circuit 3 the output of which is connected to a first squaring circuit 4 to produce an output representing the carrier component value C. The output of A/D converter 1 is further applied to a second squaring circuit 5 to which a second averaging circuit 6 is connected to produce an output representing the total component value (C+N). A substractor 7 is connected to the outputs of the circuits 4 and 6 to subtract the output of squaring circuit 4 from the output of averaging circuit 6 to obtain the noise component value N. A division circuit 8 is connected to the output of squaring circuit 4 and to the output of the subtractor 7 to determine the ratio C/N.

More specifically, the input of the demodulator is an analog signal having eye patterns at the recovery timing of symbols which corresponds to signal points. A/D converter 1 converts the sampled value into n-bit digital data stream $d_i$(where i=0, 1, 2, ..., n). If n is three, data bit stream $d_i$ can be represented as shown in Table 1. This data bit stream is applied to the absolute value circuit 2 as well as to the second squaring circuit 5.

Absolute value circuit 2 converts the data $d_i$ into an absolute value $|d_i|$. As shown in FIG. 2, the absolute value circuit 2 comprises an n-bit polarity inverter 12 and an (n+1)-bit adder 13. If n=3, polarity inverter 12 comprises exclusive OR gates 12-1, 12-2 and 12-3 each having a first input terminal connected to the most significant bit (MSB) position output of A/D converter 1 and a second input terminal connected to a respective bit position output of A/D converter 1. The polarity inverter 12 inverts the logic state of the input of each exclusive OR gate when the MSB is at logic 1 and applies the inverted bits to adder 13, while it passes the inputs of all the exclusive OR gates to adder 13 without altering their logic states when the MSB is at logic 0. Adder 13 adds MSB of the 3-bit inputs from A/D converter 1 to the least significant bit (LSB) of the 3-bit inputs from the polarity inverter 12 and produces 4-bit outputs. As a result, absolute values shown in Table 2 are derived.

TABLE 1

| Outputs of A/D Conv. 1 | |
| --- | --- |
| 3 | 011 |
| 2 | 010 |
| 1 | 001 |
| 0 | 000 |
| −1 | 111 |
| −2 | 110 |
| −3 | 101 |
| −4 | 100 |

TABLE 2

| Outputs of A.V. Circuit 2 | |
| --- | --- |
| 3 | 0011 |
| 2 | 0010 |
| 1 | 0001 |
| 0 | 0000 |
| 1 | 0001 |
| 2 | 0010 |
| 3 | 0011 |
| 4 | 0100 |

Averaging circuit 3 averages the absolute values for a period of N symbols which is sufficiently long to suppress short term variations and applies an average value to squaring circuit 4. As shown in FIG. 3, averaging circuit 3 comprises an adder 14 connected to the output of absolute value circuit 2, a one-sample delay 15 which is reset at N-symbol intervals and connected between the output of the adder 14 and a second input of the adder 14. Adder 14 and delay 15 form an integrator for integrating N symbols which is divided by a division circuit 16 by a constant N. Since the noise component contained in digital data has a Guassian distribution centered on an amplitude A at zero noise level, the noise component is cancelled out by the averaging process just described, and therefore, the output of averaging circuit 3 gives the amplitude of a signal point of the demodulated signal under noiseless conditions and is represented by Equation (1).

$$A = \frac{1}{N} \sum_{i=0}^{N-1} |d_i| \quad (1)$$

Therefore, the output of squaring circuit 4 supplies a noiseless carrier component C, or the signal power S, which can be represented by:

$$S = A^2 \quad (2)$$

Since the noise component has a Gaussian distribution with respect to the amplitude A at a noiseless signal point, the noise component power $\sigma^2$ is given by:

$$\sigma^2 = \frac{1}{N} \sum_{i=0}^{N-1} (|d_i| - A)^2 \quad (3)$$

By substituting Equation (1) into Equation (3), the following relation is obtained:

$$\sigma^2 = \frac{1}{N} \sum_{i=0}^{N-1} d_i^2 - A^2 \quad (4)$$

Figure 4:
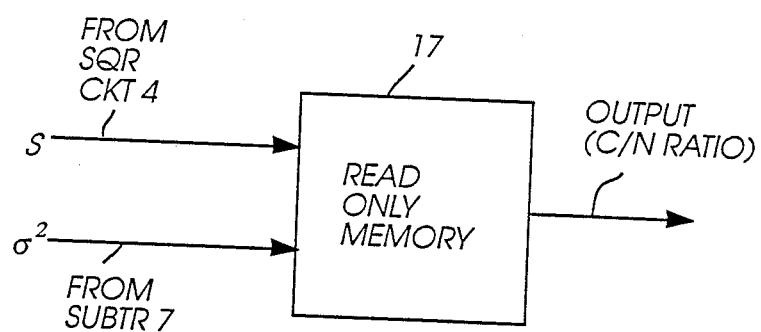
FIG. 4 is a circuit diagram of the C/N ratio divider of FIG. 1.

On the other hand, the output of A/D converter 1 is squared by second squaring circuit 5 and averaged over N symbols by the second averaging circuit 5 in a manner similar to the processes performed by averaging circuit 3 and squaring circuit 4 just described. As a result, the first term of Equation (4) can be obtained at the output of averaging circuit 6, namely, $\sigma^2+A^2$. Subtractor 7 subtracts the signal power $A^2$ at the output of squaring circuit 4 from the ($\sigma^2+A^2$) output of averaging circuit 6 to derive a noise power $\sigma^2$ which is used by division circuit 8 to divide the output $A^2$ of squaring circuit 4. As shown in FIG. 4, division circuit 8 comprises a conversion table, or a read only memory 17. A set of values $S/\sigma^2$ are stored in cell locations addressable as a function of variables S and $\sigma^2$.

Figure 5:
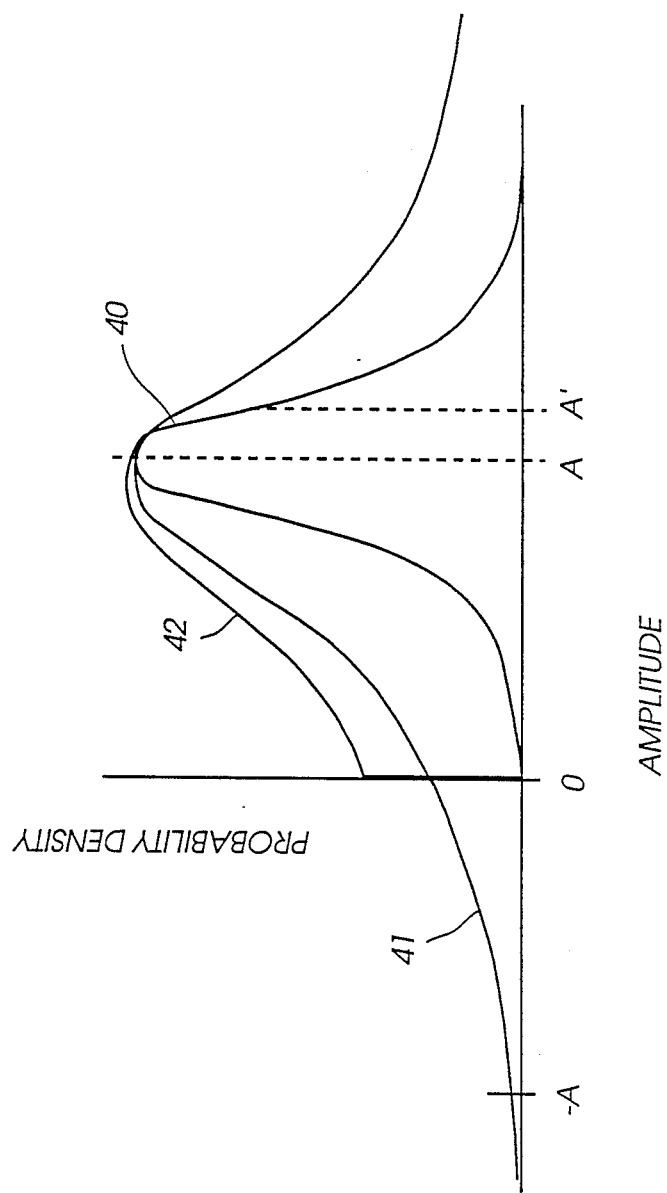
FIG. 5 is a graphic illustration of the probability density distribution of noise at various noise levels.
Figure 6:
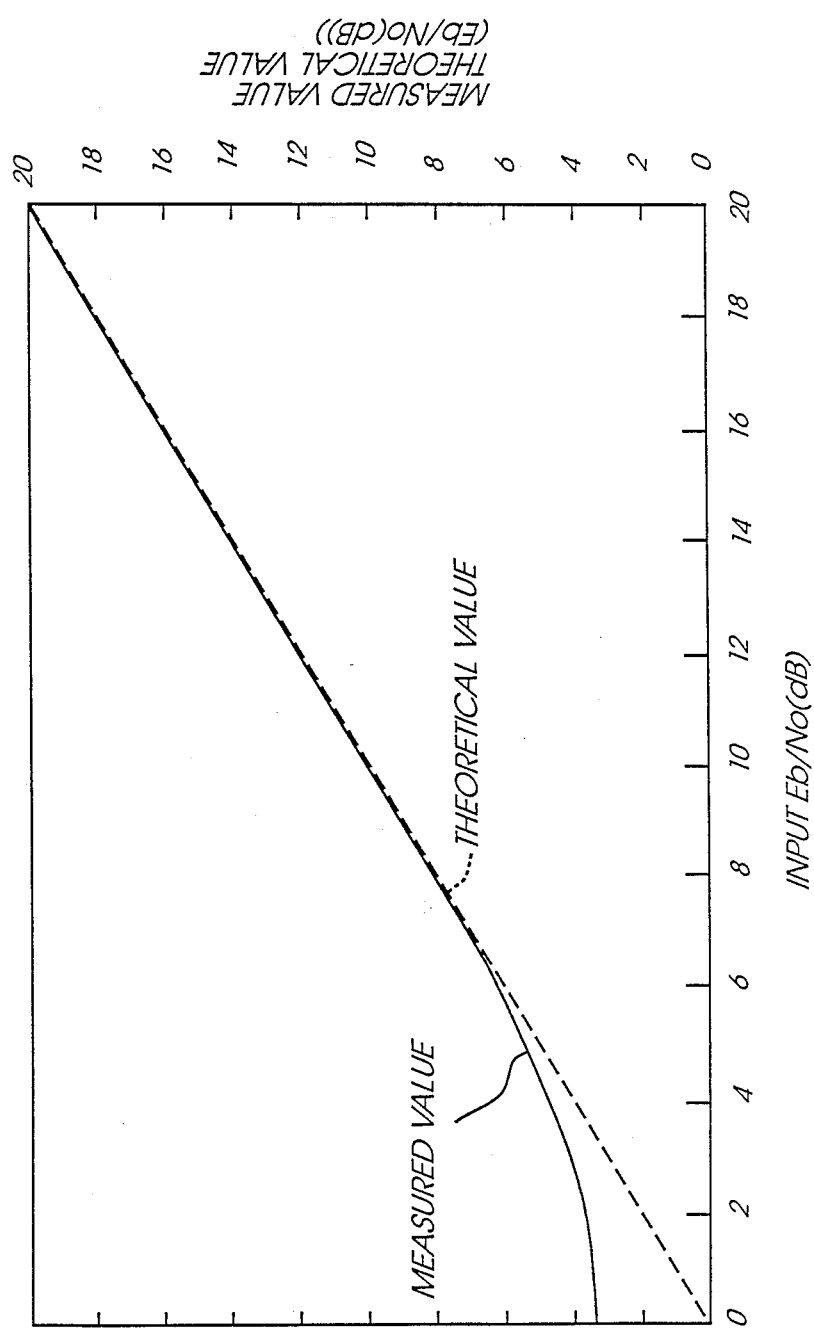
FIG. 6 is a graphic illustration of $E_b/N_o$ values measured by the detector of FIG. 1 as a function of input $E_b/N_o$ values for comparison with theoretical $E_b/N_o$ values.

Although satisfactory for most applications, the first embodiment is not suited for systems that are severely affected by noise. As shown in FIG. 5, the probability density distribution of a received 2-PSK signal follows a curve 40 which is a Gaussian distribution under low noise conditions. Thus, the polarity inversion of the negative values by absolute value circuit 2 causes the signal point with amplitude −A to be folded over to the signal point with amplitude A, while maintaining the symmetry of the curve 40. However, under high noise conditions, there is an increase in variance $\sigma^2$ of the Gaussian distribution and the probability density distribution of the received signal adopts a curve as shown at 41. Therefore, the fold-over effect of the absolute value circuit 2 will result in a distribution curve 42 under high noise conditions with the result that the average value of the amplitudes of received signal is shifted to a signal point with an amplitude A'. The amount of this error increases with increases in noise. As shown in FIG. 6, $E_b/N_o$ ratios measured with the circuit of FIG. 1 show increasing discrepancy from theoretical values as the input $E_b/N_o$ ratio decreases.

A second embodiment of the present invention is shown in FIG. 7. This embodiment eliminates the disadvantage of the first embodiment by taking advantage of the forward error coding and decoding techniques employed in digital transmission systems. Instead of using the absolute value circuit 2 of FIG. 1, the second embodiment includes a delay 20 connected to the output of A/D converter 1, an FEC (forward error correcting) decoder 21 for decoding the output of A/D converter 1 and correcting errors and feeding an FEC encoder 22. The output of encoder 22 is connected to one input of a polarity inverter 23 to which the output of delay 20 is also applied. Polarity inverter 23 supplies a decision threshold to the first averaging circuit 3.

FEC decoder 21 performs error decoding operation on the output of A/D converter 1 by correcting errors according to a known error correcting to application to the FEC encoder of a transmitter, not shown. This signal is applied to FEC encoder 22 in the same way as the transmitter's FEC encoder. With the error decoding and encoding processes, the output of FEC encoder 22 can be considerred more akin to the output of the transmitter's FEC encoder than the output of the receiver's demodulator is to it. Therefore, a binary 1 at the output of encoder 22 indicates that the received input signal is at a signal point having an amplitude A in a probability density distribution of amplitudes (FIG. 5) and a binary 0 at the encoder output indicates that the input signal is at a signal point with an amplitude −A.

The output of A/D converter 1 is delayed by circuit 20 by an amount equal to the total delay introduced by decoder 21 and encoder 22 so that the inputs to the polarity inverter 23 are synchronized with each other.

Polarity inverter 23 uses the output of FEC encoder 22 as a criterion to etermine whether the output of the delay 20 lies at a signal point having an amplitude A or at a signal point having an amplitude −A. In response to a binary 1 from encoder 22, polarity inverter 23 passes the output from delay 20 unaltered to the averaging circuit 3. In response to a binary 0, it applies the output of delay 20 to averaging circuit 3 after first inverting its polarity. As shown in FIG. 8, polarity inverter 23 comprises a NOT circuit 30 connected to the output of FEC encoder 22, exclusive OR gates 31-1 to 31-n, and an adder 32. Each exclusive OR gate 31 has a first input terminal connected to the output of the NOT circuit 30 and a second input terminal connected to a respective one of the n outputs of the delay circuit 20. Since the output of delay 20 is represented as the 2's complements of the n-bit data, binary 0 at the output of encoder 22 causes the logic states of the outputs of delay 20 to be inverted by exclusive OR gates 31-1 through 31-n and summed with a binary 1 from inverter 30 which is summed by adder 32 with the LSB of the n-bit outputs from exclusive OR gates 31, while a binary 1 at the output of encoder 22 causes the delay 20 outputs to pass through gates 31 to adder 32 without undergoing a polarity inversion.

As a result of this polarity inversion process, the probability density distribution of the demodulated signal is centered on the signal point having amplitude A, following the curve 40 of FIG. 5. Thus, the average value of the amplitudes of the received signal is made to equal the amplitude at the signal point with amplitude A.

In this embodiment, the output of the first squaring circuit 4 can be expressed by the following equation:

$$S = \left( \frac{1}{N} \sum_{i=0}^{N-1} SGN(d_i) d_i \right)^2 \tag{5}$$

where, $SGN(d_i)$ represents the criterion data from FEC encoder 22.

Figure 9:
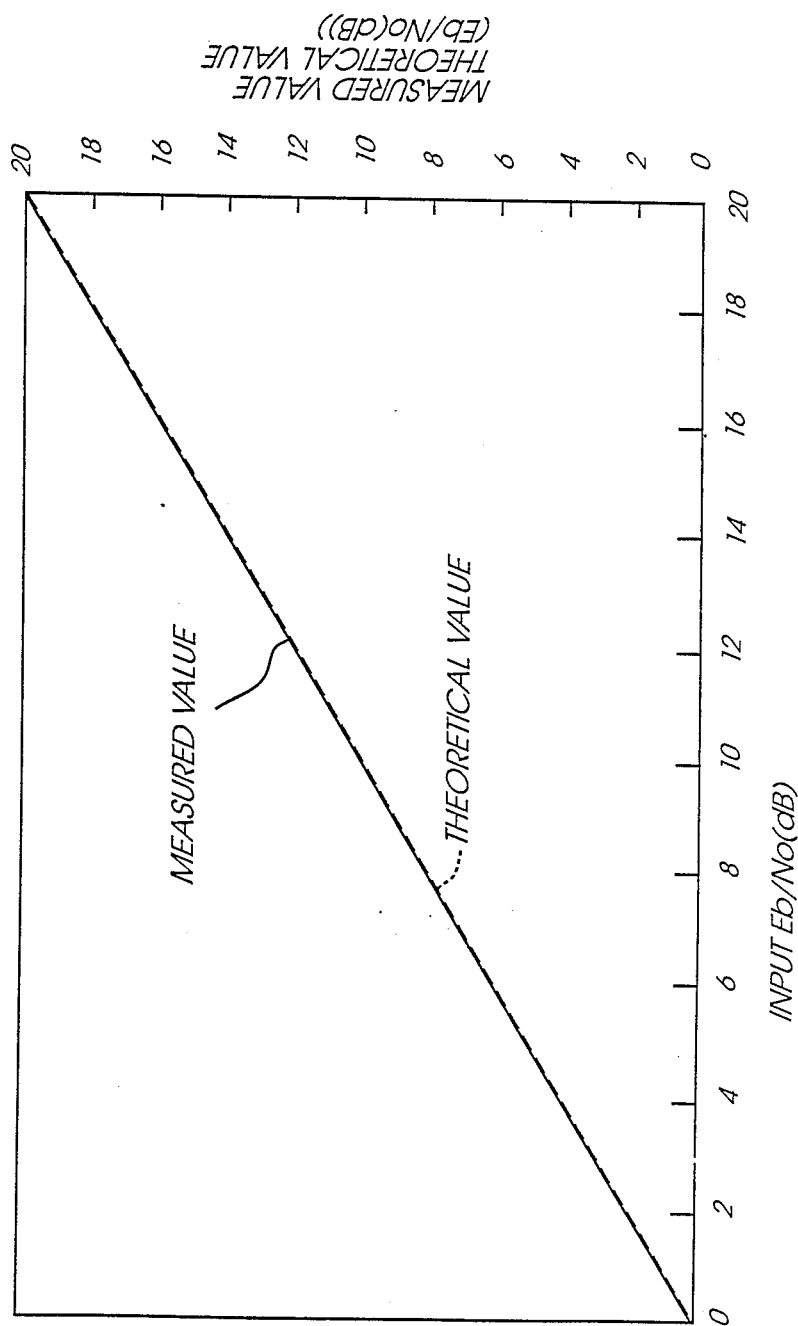
FIG. 9 is a graphic illustration of $E_b/N_o$ values measured by the detector of FIG. 7 as a function of input $E_b/N_o$ for comparison with theoretical $E_b/N_o$ values.

FIG. 9 is a graphic representation of the relationship between the $E_b/N_o$ values obtained by circuit of FIG. 7 and theoretical $E_b/N_o$ values. As is apparent, there is a complete agreement between the measured and theoretical values down to low $E_b/N_o$ input values. This indicates that C/N ratio can be precisely determined even in the face of severe transmission system noise.

To allow accurate determination of C/N ratio, the use of powerful error correcting algorithm such as soft decision Viterbi decoding algorithm or convolutional decoding techniques is preferred.

Figure 10:
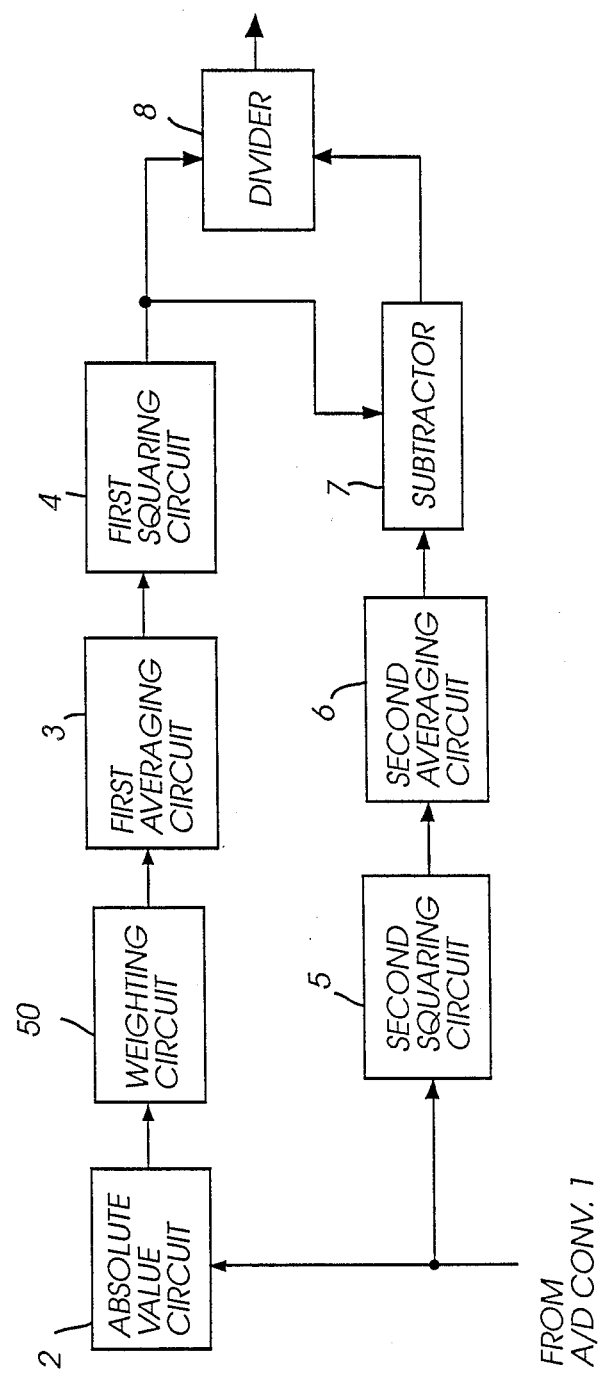
FIG. 10 is a block diagram of the carrier-to-noise detector according to a third embodiment of the present invention.

Measurement of C/N ratio of a system without interrupting its service can also be effected alternatively by a third embodiment shown in FIG. 10. This embodiment differs from the first embodiment by the inclusion of a adaptive weighting circuit 50.

Since the probability density distribution of the amplitudes of the received signal adopts a curve A (see FIG. 12a) at low noise levels and a curve B at high noise levels (FIG. 12b), at low noise levels the averaged absolute values of amplitudes becomes approximately equal to the amplitude at the signal point S. However, at high noise levels, the averaged absolute values result in an asymmetrical curve C with respect to point S.

The absolute value of the output of A/D converter 1 is taken by absolute value circuit 2 and weighted with a prescribed weighting factor by the adaptive weighting circuit 50. Let S(t) represent the signal component of a received signal and $\overline{N(t)}$ the enoise component. Since noise component has a Gaussian distribution, an average value N(t) of noise components $\underline{N(t)}$ can be regarded as being equal to zero, namely $\overline{N(t)}=0$. The output signal of the adaptive weighting circuit 50 is applied to the first averaging circuit 3 where short term variations, i.e., noise component N(t) are removed to produce an output $\overline{|S(t)|W(u)}$, where W(u) represents the weighting factor, and $u=|S(t)+N(t)|$. Therefore, the output signal of the first squaring circuit 4 is given by $\overline{S(t)\cdot W(u)}$. This signal is applied to the subtractor 7 and division circuit 8.

By the squaring and averaging opeations performed by the squaring circuit 5 and the averaging circuit 6 on the output $\{S(t)+N(t)\}$ of A/D converter 1, the input signal applied from averaging circuit 6 to the subtractor 7 is given by the following relation:

$$\overline{\{S(t)+N(t)\}^2} = \overline{S(t)^2 + N(t)^2 + 2S(t)N(t)} \quad (6)$$
$$= \overline{S(t)^2} + \overline{N(t)^2} + \overline{2S(t)N(t)}$$

Since $\overline{N(t)}=0$, the third term of Equation (6) becomes zero and so Equation (6) can be written as:

$$\overline{\{S(t)+N(t)\}^2} = \overline{S(t)^2} + \overline{N(t)^2} \quad (7)$$

This weighting factor is determined to that the undesired fold-over effect produced by taking the absolute values is minimized. The following conditions are examples of weighting factor in which the value x represents the output of the absolute value circuit 2 and TH is a threshold value.

$W(x)=x$ (1)

$W(x)=1 \quad x>TH$ (2)

$W(x)=0 \quad x\leq TH$ $W(x)=1 \quad x>TH$ (3)

$W(y)\ -\alpha\ =x\leq TH$ $W(x)=x^2$ (4)

Figure 11:
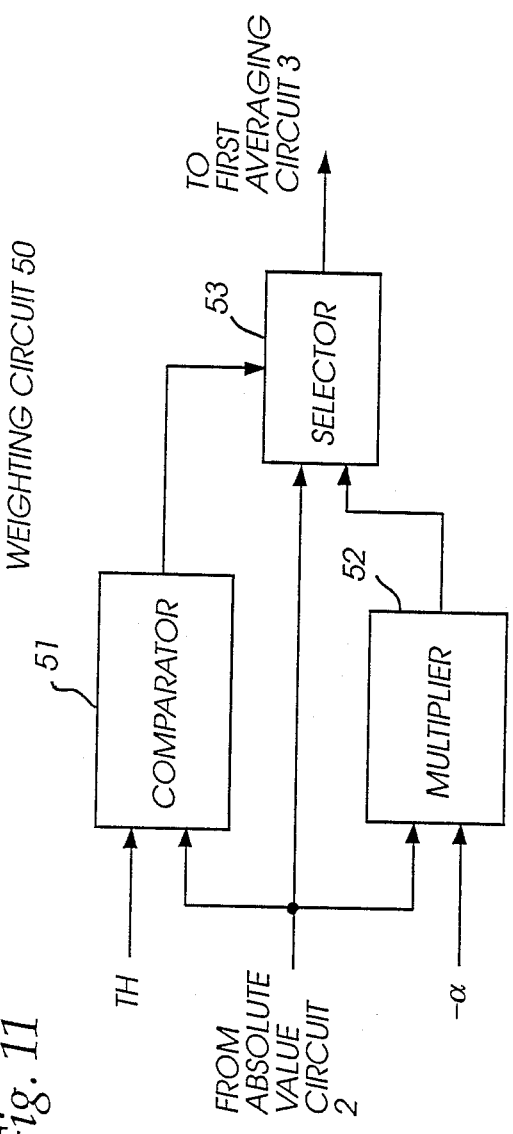
FIG. 11 is a circuit diagram of the weighting circuit of FIG. 10.

FIG. 11 is one example of the adaptive weighting circuit 50 which is constructed according to the criteria in (3) above. Weighting circuit 50 comprises a comparator 51, a multiplier 52 and a selector 53 to which the outputs of absolute circuit 2 and multiplier 52 are applied to be selectively coupled to the division circuit 8. Comparator 51 compares the output of the absolute value circuit 2 to the threshold value TH and applies a logic selection signal to the selector 53. If the output of absolute value circuit 2 is higher than threshold value TH, the selection signal is at logic 1 and if otherwise, the selection signal is at logic 0. Multiplier 52 multiplies the weighting factor $-\alpha$ on the output of the absolute value circuit 2 and applies it to selector 53. If the comparator 51 output is at logic 1, the output of absolute value circuit 2 is passed through the selector 52 to the averaging circuit 3 and if otherwise, the output of multiplier 52 is passed to the averaging circuit 3.

Figure 12B:
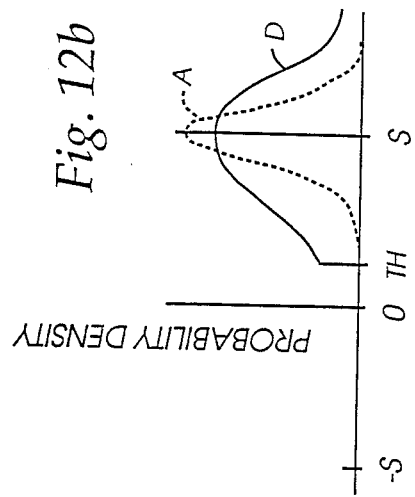
FIGS. 12a and 12b are graphic illustrations of the probability density distributions of noise components derived respectively from the outputs of absolute value circuit and weighting circuit of FIG. 10.
Figure 12A:
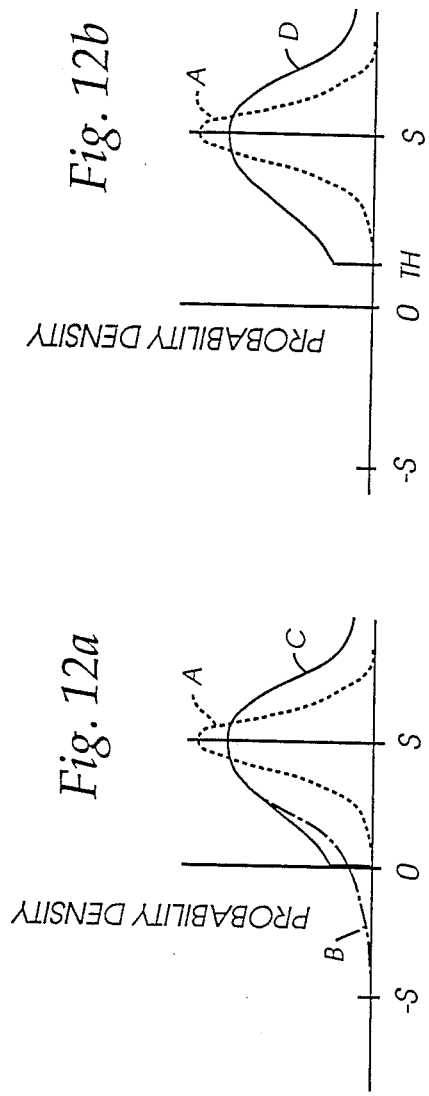

Due to the weighting operation, the probability density distribution of the amplitudes of input signal follows a curve shown at D in FIG. 12b which is shifted to the right from the position of curve C (FIG. 12a) by an amount equal to the distance between the intermediate point 0 and the threshold value TH. The weighting factor $-\alpha$ is so determined that the noise component which would otherwise cause a most serious fold-over effect is reduced to a minimum.

Figure 13:
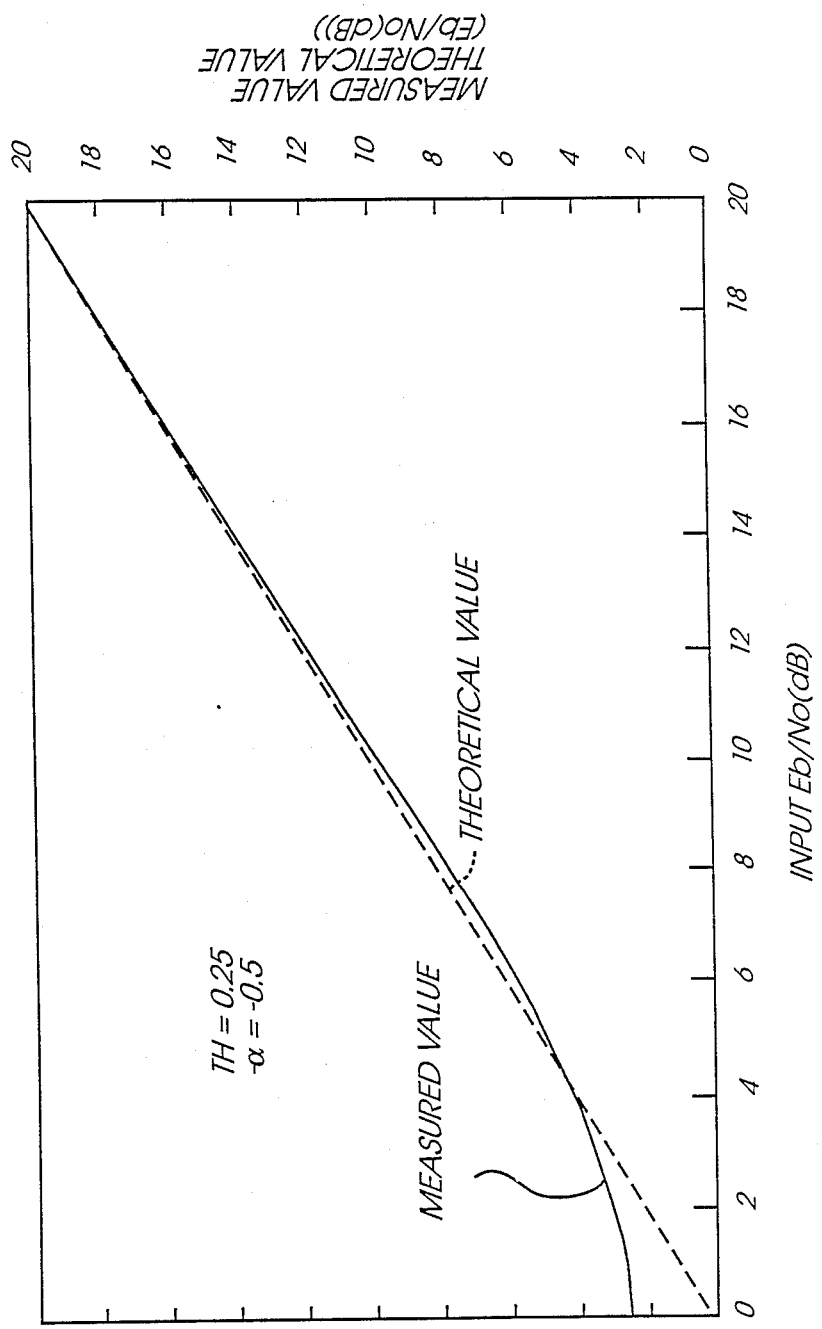
FIG. 13 is a graphic illustration of $E_b/N_o$ vales measured by the detector of FIG. 10 as a function of input $E_b/N_o$ values for comparison with theoretical $E_b/N_o$ values.

Subtractor 7 performs the following subtraction $$\overline{S(t)^2} + \overline{N(t)^2} - \overline{S(t)\cdot W(u)^2}$$

to produce an output which represents $\overline{N(t)}$, which is applied to the division circuit 8. As in the first embodiment, the division circuit 8 comprises a conversion table to which the signals $\overline{N(t)^2}$ and $\overline{S(t)^2 + N(t)^2}$ are applied to address signals. FIG. 13 is a graphic representation of the characteristic of the third embodiment using a threshold value 0.25, and a weighting factor $-0.5$. Comparison between FIGS. 6 and 13 indicates that precision of the circuit is improved by as much as 4 dB at high noise levels (low $E_b/N_o$ inputs).

The C/N ratio of a demodulator output is found to vary with a deviation of the frequency of the carrier recovered by the demodulator from the frequency of the received carrier. The carrier-to-noise ratio detector of the present invention can therefore be used instead of the costly automatic frequency control circuit for preventing the demodulator from being locked in a pseudo-sync state. This is accomplished by controlling a voltage controlled oscillator provided in a closed loop of the demodulator in accordance with the derived C/N ratio such that the latter is maintained at a maximum level.

Figure 14:
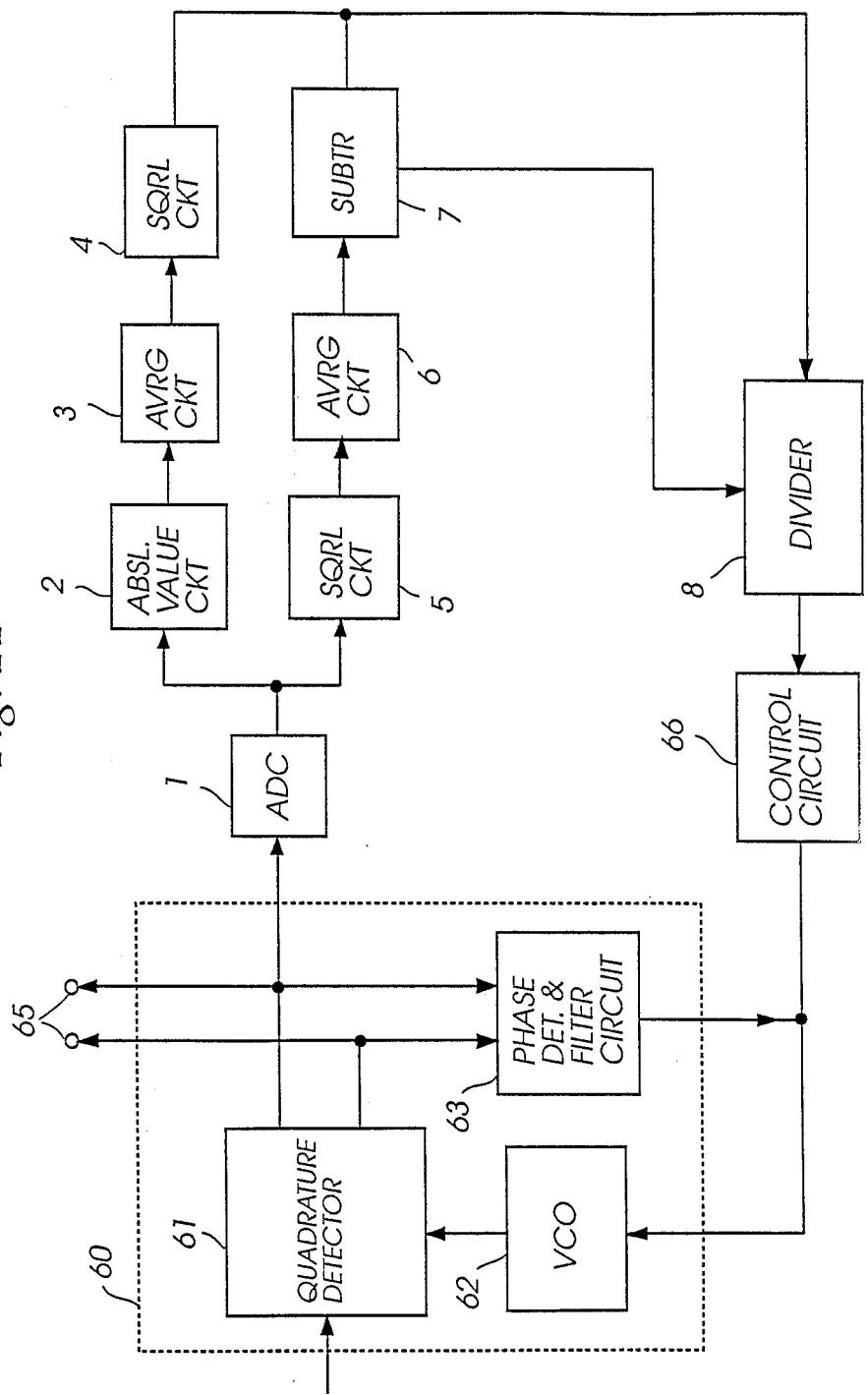
FIG. 14 is a block diagram of the carrier-to-noise ratio according to a fourth embodiment of the invention.

As shown in FIG. 14, pseudo sync detector circuit can be implemented by the C/N ratio detector of the present invention. A demodulator 60 includes a quadrature detector 61 which receives an input PSK signal at terminal 64 and a recovered carrier from a voltage controlled oscillator 62 and produces demodulated signals at terminals 65. The demodulated output signals are applied to a phase detection and filtering circuit 63 to control the VCO 62 in accordance with a phase difference detected between the two output signals. One of the output signals is applied to the input of the C/N ratio detector of the present invention which is identical to that shown in FIG. 1. The output of the division circuit 8 of the C/N ratio detector is applied to a controller 66 including a differential amplifier for comparison with a reference threshold. This reference threshold corresponds to a DC voltage at which the VCO 62 generates a carrier at the desired frequncy when the C/N ratio of the demodulator 60 is at a maximum value. The output of the differential amplifier 66 is representative of the deviation of the C/N ratio from its maximum value and is applied to the control terminal of the VCO 62.

When the demodulator is in a sync state, the C/N ratio of the demodulator is at the maximum value. However, if it goes out of sync and enters a pseudo-sync state, the noise component increases in the outputs of the demodulator 60 and hence the C/N ratio of the demodulator decreases, causing the output of the difference amplifier 66 to vary correspondingly. In this way, the VCO frequency is controlled until the output of the division circuit 8 returns to the maximum value of the C/N ratio.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A carrier-to-noise detector for a digital transmission system, comprising:

an analog-to-digital converter for being connected to a demodulator of said digital transmission system for sampling an output signal of said demodulator at a symbol clock rate of said demodulator and converting the sampled signal to a digital output signal having positive and negative values;

absolute value converting means for converting said digital output signal from said analog-to-digital converter into a digital signal of an absolute value;

first averaging means for averaging said absolute value digital signal over a period of a plurality of symbols sufficient to suppress short term variations;

first squaring means for squaring the value of said absolute value digital signal from said averaging means;

second squaring means for squaring the value of the digital signal from said analog-to-digital converter;

second averaging means for averaging said squared digital signal from said second squaring means over a period of a plurality of symbols sufficient to suppress short term variations;

means for subtracting the squared digital output signal of said first squaring means from the averaged digital output signal of said second averaging means; and means for deriving a ratio between an output of said first squaring means and an output of said subtracting means.

2. A carrier-to-noise detector as claimed in claim 1, wherein the digital output signal of said analog-to-digital converter is an n-bit 2's complement signal, and wherein said absolute value converting means comprises:

a bit inverter for inverting the logic state of said n-bit outputs of said analog-to-digital converter when the most significant bit thereof is at logic 1 to produce bit-inverted n-bit outputs and producing noninverted n-bit outputs when said most significant bit is at logic 0; and an adder for summng said most significant bit to the least significant bit of said bit-inverted and noninverted n-bit outputs.

3. A carrier-to-noise detector as claimed in claim 1, wherein said means for deriving the ratio comprises a memory for storing a plurality of carrier-to-noise ratio values in locations addressable as a function of the outputs of said first squaring means and said subtracting means.

4. A carrier-to-noise detector as claimed in claim 1, wherein said absolute value converting means comprises:

a forward error correcting decoder connected to the output of said analog-to-digital converter;

a forward error correcting encoder connected to the output of said forward error correcting decoder;

a delay circuit for introducing a delay to the output signal of said analog-to-digital converter by an amount equal to a total delay introduced by said forward error correcting decoder and said encoder; and a polarity inverter for inverting the polarity of the output of said delay circuit depending on the logic state of the output of said forward error correcting encoder to supply the polarity inverted output to said first averaging means and supplying the output of said delay circuit without inverting the polarity thereof to said first averaging circuit.

5. A carrier-to-noise detector as claimed in claim 4, wherein the digital output signal of said analog-to-digital converter is an n-bit 2's complement signal, and wherein said polarity inverter comprises:

a bit inverter for inverting the logic states of the output of said delay circuit or not inverting said logic states depending on the logic state of the output of said encoder; and an adder for summing the output of said encoder to the least significant bit of said inverted and noninverted n-bit outputs from said bit inverter.

6. A carrier-to-noise detector as claimed in claim 1, further comprising weighting means for multiplying said absolute value digital signal by a weighting factor and applying the weighted digital signal to said first averaging means.

7. A carrier-to-noise detector as claimed in claim 6, wherein said weighing means comprises:

a comparator for comparing said absolute value digital signal with a reference value and producing a first switching control signal when said absolute value digital signal is higher than said reference value and a second switching signal when said absolute value digital signal is lower than said reference value;

a multiplier for multiplying said weighting factor on said absolute value digital signal; and a selector for applying said absolute value digital signal to said first averaging means in response to said first switching control signal and applying an output of said multiplier to said first averaging circuit in response to said second switching signal.

8. A carrier-to-noise detector as claimed in claim 1, wherein said demodulator includes a voltage controlled oscillator for recovering a carrier which replicates the carrier of a received signal, further comprising means responsive to said ratio deriving means for controlling the output frequency of said voltage controlled oscillator such that said ratio deriving means produces an output of a maximum level.

9. A phase controlled demodulation system for digital communication, comprising:

a quadrature detector for receiving a modulated digital signal for generating therefrom a pair of I and Q demodulated signals;

a phase difference detection and filter circuit for detecting a phase difference between said I and Q demodulated signals;

means for detecting a carrier-to-noise ratio of one of said I and Q demodulated signals;

means for detecting a ratio difference between the detected carrier-to-noise ratio and a predetermined value; and a voltage controlled oscillator responsive to the detected phase difference and the detected ratio difference for generating a carrier which replicates the carrier of said received digital signal and applying said carrier to said quadrature detector.

10. A phase controlled demodulation system as claimed in claim 9, wherein said carrier-to-noise ratio detecting means comprises:

an analog-to-digital converter for sampling one of said I and Q demodulated signals at a symbol clock rate and converting the sampled signal to a digital output signal having positive and negative values;

absolute value converting means for converting said digital output signal from said analog-to-digital converter into a digital signal of an absolute value;

first averaging means for averaging said absolute value digital signal over a period of a plurality of symbols sufficient to suppress short term variations;

first squaring means for squaring the value of said absolute value digital signal from said first averaging means;

second squaring means for squaring the value of the digital signal from said analog-to-digital converter;

second averaging means for averaging said squared digital signal from said second squaring means to suppress short term variations;

means for subtracting the squared digital output signal of said first squaring means from the averaged digital output signal of said second averaging means; and means for deriving a ratio between an output of said first squaring means and an output of said subtracting means as said carrier-to-noise ratio and applying the derived ratio to said ratio difference detecting means.

11. A carrier-to-noise detector for a digital transmission system, comprising:

first means, connected to an output signal of said transmission system which contains a signal component and a noise component, for converting the output signal to a digital output signal;

second means coupled to the first means and effective for generating a first signal which is proportional to said signal component contained in said output signal of said digital transmission system;

third means coupled to said first means and effective for generating a second signal which is proportional to the sum of said noise component and said signal component contained in said output signal;

fourth means coupled to said second and third means and effective for generating a third signal which is proportional to a difference of said first and second signals; and fifth means coupled to said second and fourth means and effective for generating a fourth signal which is proportional to the ratio of said first and third signals and is indicative of the carrier-to-noise ratio of the signal component to the noise component in said transmission system.

12. The detector of claim 11 wherein the second means includes: an absolute value generating circuit coupled to the first means; a first averaging circuit coupled to the absolute value generating circuit; and a first squaring circuit coupled to the first averaging circuit, the third means includes: a second squaring circuit coupled to the first means; and a second averaging circuit coupled to the second squaring circuit, the third means comprising a subtracter, and the fourth means comprising a divider.

13. The detector of claim 11 wherein said noise component has a general Gaussian distribution which, under ideal conditions, is centered about a predetermined value and further including means effective for symmetrizing the noise distribution about said predetermined value whenever said noise component assumes a distribution which is asymmetric relative to said predetermined value.

* * * * *

UNITED STATES PATENT AND TRADEMARK OFFICE
CERTIFICATE OF CORRECTION

PATENT NO. : 4,835,790

DATED : May 30, 1989

INVENTOR(S) : Shousei Yoshida, Susumu Otani; Toshiya Todoroki

It is certified that error appears in the above-identified patent and that said Letters Patent is hereby corrected as shown below:

On the face of the patent, change Application No. from 210,657 to --210,653--.

Signed and Sealed this

Thirteenth Day of March, 1990

Attest:

JEFFREY M. SAMUELS

*Attesting Officer*      *Acting Commissioner of Patents and Trademarks*